United States Patent
Nakano et al.

(10) Patent No.: US 8,971,678 B2
(45) Date of Patent: Mar. 3, 2015

(54) SPACER RESIN PATTERN HELPING TO REDUCE OPTICAL COUPLING LOSS IN OPTICAL WAVEGUIDE FOR LIGHT-EMITTING ELEMENT OR LIGHT-RECEIVING ELEMENT ON SEMICONDUCTOR

(71) Applicant: International Business Machines Corporation, Armonk, NY (US)

(72) Inventors: Daiju Nakano, Kanagawa-ken (JP); Masao Tokunari, Kanagawa (JP); Kazushige Toriyama, Kanagawa (JP); Yutaka Tsukada, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 13/863,433

(22) Filed: Apr. 16, 2013

(65) Prior Publication Data
US 2013/0301986 A1  Nov. 14, 2013

(30) Foreign Application Priority Data

Apr. 17, 2012  (JP) ................................. 2012-093713

(51) Int. Cl.
| | |
|---|---|
| G02B 6/42 | (2006.01) |
| H01L 33/58 | (2010.01) |
| H01L 31/0232 | (2014.01) |
| G02B 6/12 | (2006.01) |
| G02B 6/26 | (2006.01) |
| H01L 25/16 | (2006.01) |

(52) U.S. Cl.
CPC .............. *G02B 6/4236* (2013.01); *H01L 33/58* (2013.01); *H01L 31/0232* (2013.01); *G02B 6/4214* (2013.01); *H01L 25/167* (2013.01)
USPC ............................................... 385/31; 385/14

(58) Field of Classification Search
CPC ........................... G02B 6/4212; G02B 6/4214
USPC ...................................................... 385/14, 31
See application file for complete search history.

(56) References Cited

U.S. PATENT DOCUMENTS

| | | | | |
|---|---|---|---|---|
| 7,092,603 B2* | 8/2006 | Glebov et al. | ................... | 385/51 |
| 7,228,020 B2* | 6/2007 | Weigert | .......................... | 385/14 |
| 7,989,148 B2* | 8/2011 | Nakashiba et al. | ........... | 430/318 |

(Continued)

FOREIGN PATENT DOCUMENTS

| | | |
|---|---|---|
| JP | 2001-188150 A | 7/2001 |
| JP | 2002-131586 A | 5/2002 |
| JP | 2003-167175 A | 6/2003 |
| JP | 2003-215371 A | 7/2003 |
| JP | 2004-241631 A | 8/2004 |
| JP | 2007-227643 A | 9/2007 |

*Primary Examiner* — Rhonda Peace
(74) *Attorney, Agent, or Firm* — Vazken Alexanian (57) ABSTRACT

Spacer resin pattern layer which precisely aligns a light-emitting element or a light-receiving element relative to both a waveguide pattern layer and electrical circuit pattern layer from the semiconductor wafer level. A substratum of resin having a through-hole provided for electrical communication with an electrical circuit pattern layer is formed on a semiconductor wafer. A truncated cone-shaped three-dimensional reflective surface is formed to guide the emitted light towards or received light from a waveguide pattern layer. A metal film is deposited planarly in a predetermined range from the center when positioned relative to the position of the through-hole. A truncated cone-shaped mold is stamped in the center. By modifying the direction of the light using this tapered structure, the precision tolerance is increased and optical loss is reduced.

18 Claims, 6 Drawing Sheets

(56) References Cited

U.S. PATENT DOCUMENTS

| | | | |
|---|---|---|---|
| 8,708,576 B2* | 4/2014 | Shacklette et al. | 385/88 |
| 8,805,131 B2* | 8/2014 | Shiraishi | 385/14 |
| 2006/0045413 A1* | 3/2006 | Weigert | 385/15 |
| 2008/0131050 A1* | 6/2008 | Yanagisawa | 385/14 |
| 2009/0104565 A1* | 4/2009 | Nakashiba et al. | 430/312 |
| 2012/0002915 A1* | 1/2012 | Shiraishi | 385/14 |
| 2013/0301986 A1* | 11/2013 | Nakano et al. | 385/31 |

* cited by examiner

SPACER RESIN PATTERN HELPING TO REDUCE OPTICAL COUPLING LOSS IN OPTICAL WAVEGUIDE FOR LIGHT-EMITTING ELEMENT OR LIGHT-RECEIVING ELEMENT ON SEMICONDUCTOR

CROSS-REFERENCE TO RELATED APPLICATION

This application claims priority under 35 U.S.C. §119 from Japanese Patent Application No. 2012-089261 filed Apr. 17, 2012 the entire contents of which are incorporated herein by reference.

BACKGROUND OF THE INVENTION

1. Field of the Invention

The present invention relates to a design for a spacer resin (SR) pattern layer that is able to reduce optical coupling loss by guiding light through an optical waveguide for a semiconductor light-emitting element or light-receiving element.

More particularly, the present invention relates to a specific method for forming a spacer resin pattern layer able to precisely align a light-emitting element such as, but not limited to, a vertical-type surface-emitting laser (VCSEL) or light-receiving element such as, a photodetector (PD) formed as a gallium arsenide (GaAs) semiconductor with respect to a waveguide (WG) pattern layer and an electrical circuit (EC) pattern layer arranged in a manner so as to be laminated on each other.

2. Description of Related Art

Figure 1:
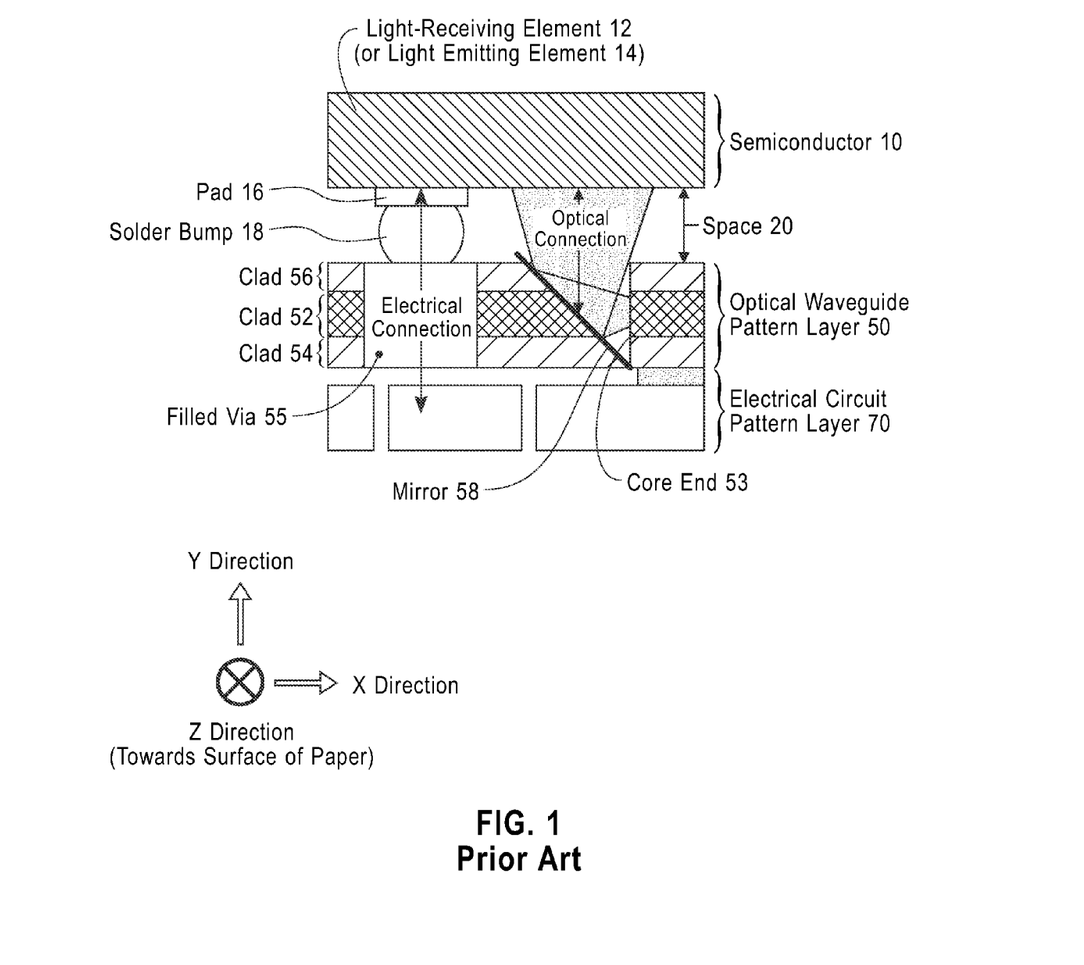
FIG. 1 is a schematic view showing a well-known configuration for a laminate of the prior art.

FIG. 1 is a schematic view showing the configuration of the prior art. The purpose of the present invention is to reduce the optical coupling loss between each element in the basic configuration of such a laminate.

In the basic configuration of such a laminate, optical waveguide pattern layer 50 and electrical circuit pattern layer 70 are arranged so as to be laminated on each other. In the following explanation, enclosing reference numbers and such in parentheses is not meant to have a limiting sense.

Precision alignment is important because the semiconductor chip and the waveguide layer and the electrical circuit layer are required to be optically and electrically connected.

Light-emitting element (VCSEL) 14 or light-receiving element 12, such as a photodetector (PD), is formed on a semiconductor 10. Semiconductor 10 can be silicon (Si). There are no particular limitations with respect to materials.

Here, light-emitting element 14 is typically a VCSEL, and light-receiving element 12 is typically a PD.

In FIG. 1, light-receiving element (PD) 12 is depicted as a GaAs semiconductor. The light from optical waveguide pattern layer 50 is reflected by mirror 58 to input the light to the PD.

The main elements of optical waveguide (WG) pattern layer 50 are core layer 52 and cladding layers 54, 56 surrounding the core (sandwiching the core vertically in the drawing).

The light is reflected at the boundary between core layer 52 and cladding layers 54, 56 to propagate inside core layer 52. Due to this principle, it is expected that the light is confined to the core and goes straight without spreading.

However, the light spreads in the space between core end 53 and mirror 58. The light is connected via space 20 from mirror 58 to light-receiving element 12, but some spreading of the light cannot be avoided. In FIG. 1, the spreading of the beam is exaggerated.

Space 20 from mirror 58 to light-receiving element (PD) 12 is preferably as short as possible.

Because of the significant impact in the reflected direction, the reflection angle of mirror 58 also has to be set with precision.

When a higher response speed is pursued, the effective light-receiving area of light-receiving element (PD) 12 tends to become smaller.

From this standpoint, it is important to precisely align the light from optical waveguide pattern layer 50 with the effective light-receiving area of light-receiving element 12. Coupling loss will increase unless the alignment is precise.

The GaAs semiconductor 10 is connected electrically to electrical circuit pattern layer 70 via filled via 55. In this example, solder bump 18 arranged on pad 16 of semiconductor 10 is used to form an electrical connection with electrical circuit pattern layer 70.

Because filled via 55, in this example, has to physically pass through optical waveguide pattern layer 50, it has to appear as an element of optical waveguide pattern layer 50.

In FIG. 1, optical waveguide pattern layer 50 is depicted as being severed by filled via 55, but the actual optical waveguide pattern layer 50 is continuous in the depth direction of the paper. Therefore, it is important to note that it has not been severed in the depth direction.

This also means, for example, that the depth position of filled via 55 formed to provide an electrical connection also differs from the depth position of mirror 58.

In other words, the depiction of FIG. 1 is meant to be a schematic drawing showing the elements in cross-section for explanatory purposes.

Solder bump 18 also establishes a mechanical connection when it is solidified after melting. Therefore, it fixes semiconductor 10 relative to optical waveguide pattern layer 50 in addition to electrical circuit pattern layer 70.

Therefore, it is important to position filled via 55, in the X direction, Y direction, and Z direction, relative to the position of optical waveguide pattern layer 50.

The precision of the positioning in the X direction and Z direction (the Z direction is the depth direction of the paper) has a direct impact on the effective light-receiving area of light-receiving element 12.

The precision of the positioning in the Y direction has an impact on coupling loss when, as mentioned above, spreading light in space 20 is taken into account.

JP2004-241631 discloses a reverse taper-shaped base member on the light-receiving element.

JP2001-188150 discloses an optical waveguide formed on a substrate and an optical coupler to couple light from the waveguide with an optical component.

JP2002-131586 discloses an optical communication module having a mirror for reflecting optical signals.

JP2003-215371 discloses the placement of a spacer between a VCSEL and an optical waveguide.

JP2007-227643 discloses a tapered reflection path provided between a microlens and a light-receiving element.

JP2003-167175 discloses a curved reflective surface.

However, none of the patent literature discloses a design concept for forming a spacer resin pattern layer having a tapered reflection path which is highly effective at optically coupling light-emitting element 14 or light-receiving element 12 formed as semiconductor 10 relative to both optical waveguide pattern layer 50 and electrical circuit pattern layer 70 on the upper surface of the wafer of semiconductor 10.

SUMMARY OF THE INVENTION

The present invention provides a spacer resin pattern layer which is manufactured by wafer-level process to couple light efficiently between a light-emitting element or a light-receiving element and a waveguide pattern layer.

Accordingly, one aspect of the present invention provides for a substratum of resin having a through-hole provided for electrical communication with the electrical circuit pattern layer is formed on a semiconductor wafer. A truncated cone-shaped three-dimensional reflective surface is formed on the formed substratum of resin to guide the emitted light towards the waveguide pattern layer or to guide the received light from the waveguide pattern layer. The truncated cone shape can be, but is not limited to, a round or polygonal shape. A metal film is deposited planarly on the surface of the substratum in a predetermined range from the center when positioned relative to the position of the through-hole. The metal film can be of a donut-shaped, round or polygonal shape. A truncated cone-shaped mold is stamped in the center. The truncated cone-shaped mold can be of a round or polygonal shape and made from gold.

Another aspect of the present invention provides a method of forming a spacer resin pattern layer.

Because the formed spacer resin pattern layer is able to precisely align the light-emitting element or light-receiving element formed as a semiconductor relative to both the optical waveguide pattern layer and electrical circuit pattern layer, optical loss can be reduced.

Because the direction of the light is modified using a tapered structure with a truncated cone shape that can be round or polygonal in shape, the precision tolerance for the set reflection angle of mirror 58, which has such as significant impact in the reflection direction, is also increased.

DETAILED DESCRIPTION OF THE PREFERRED EMBODIMENTS

A specific method will now be disclosed for forming a spacer resin pattern layer to precisely align a light-emitting element or light-receiving element formed as a semiconductor relative to an optical waveguide pattern layer and electrical circuit pattern layer where the optical waveguide pattern layer and the electrical circuit pattern layer are arranged in a manner so as to be laminated on each other.

The explanation of this method will be divided among the first through fourth examples.

Figure 4:
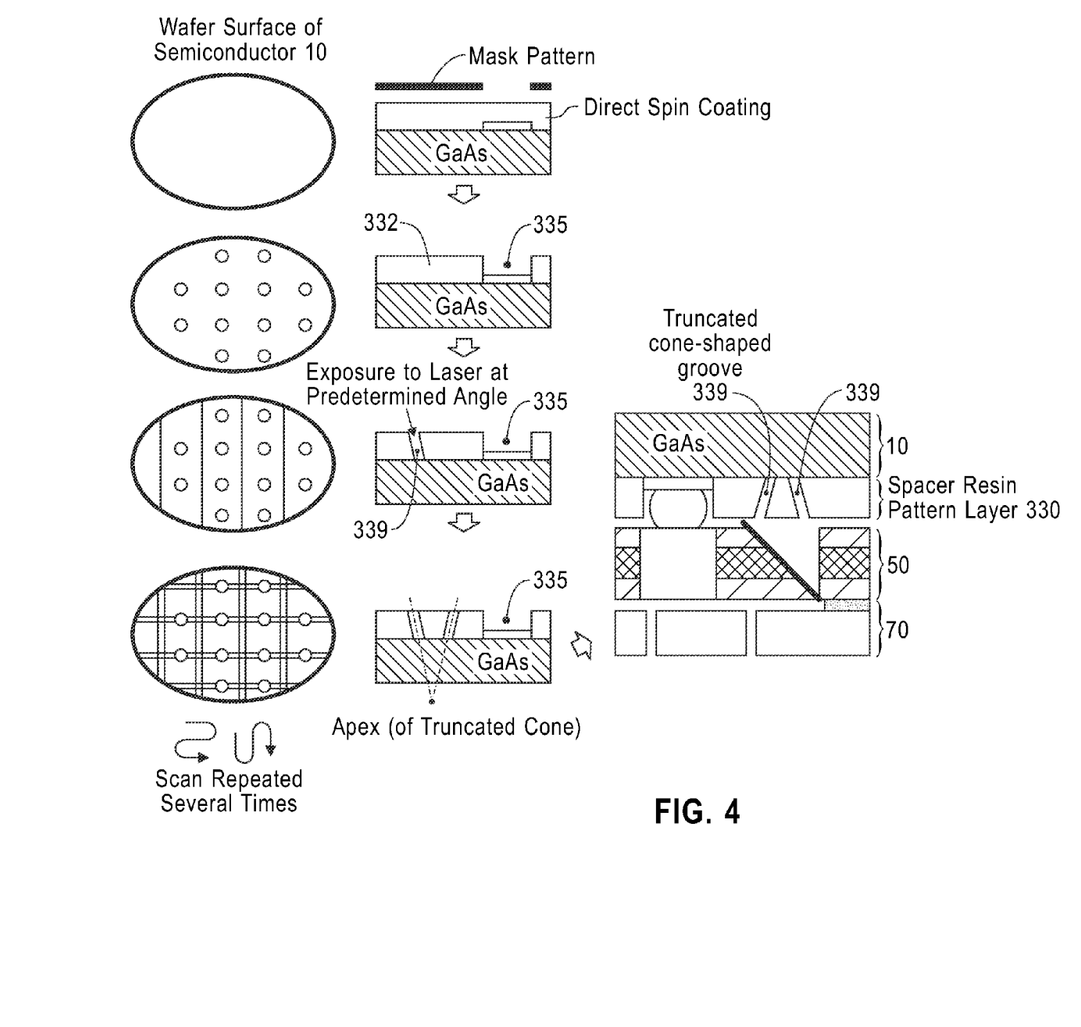
FIG. 4 is a diagram showing the method of forming a truncated cone-shaped groove in the third example of the present invention.
Figure 5:
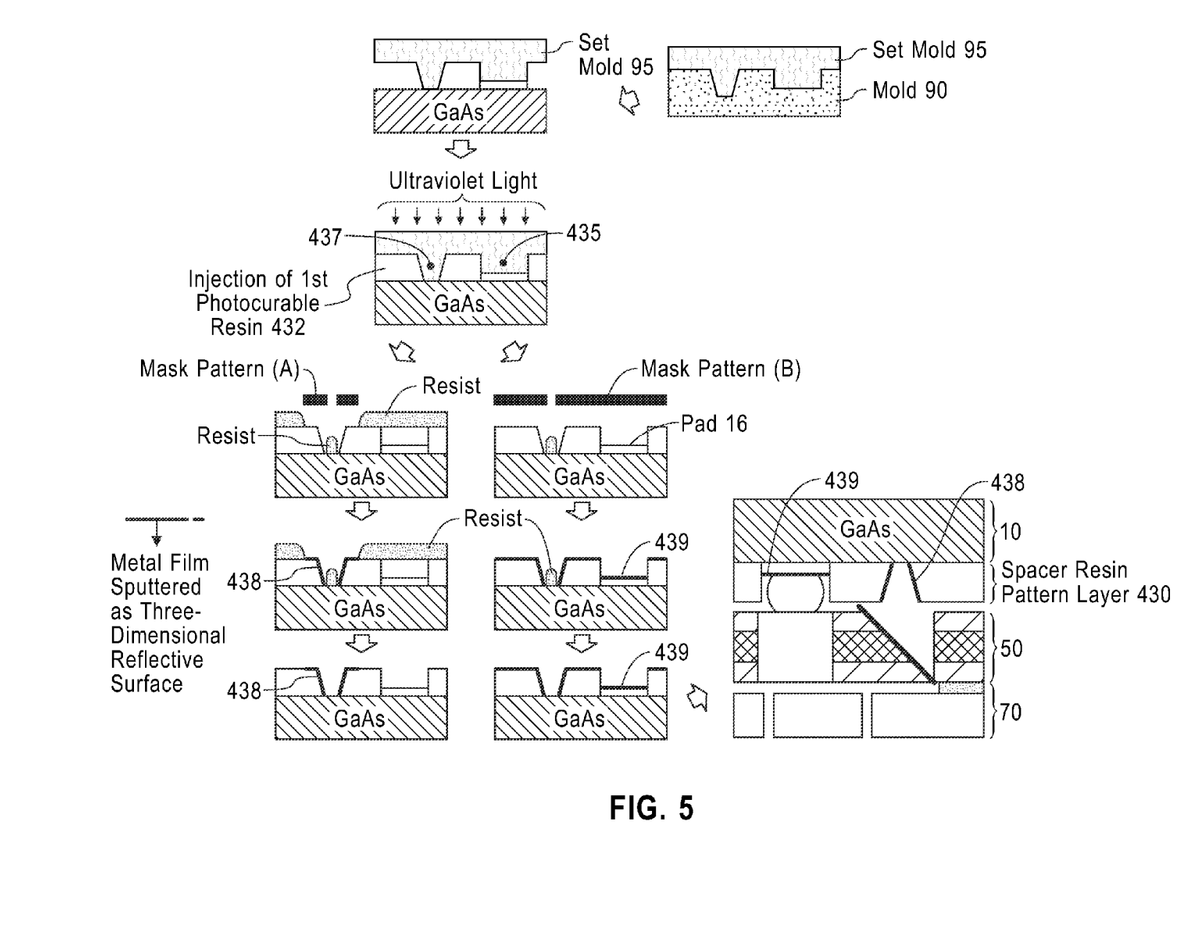
FIG. 5 is a diagram showing the method of forming a truncated cone-shaped three-dimensional reflective surface, by initially forming a truncated cone, then forming metal thin film on the inside surface.

The spacer resin pattern layer is denoted by the reference numbers 130 (first example, FIG. 2), 230 (second example, FIG. 3), 330 (third example, FIG. 4), and 430 (fourth example, FIG. 5).

The reference numbers for the elements other than the spacer resin pattern layer are the same reference numbers used in FIG. 1. These reference numbers are displayed in FIG. 2 through FIG. 5 for comparison to the schematic diagram explained in FIG. 1.

Figure 2:
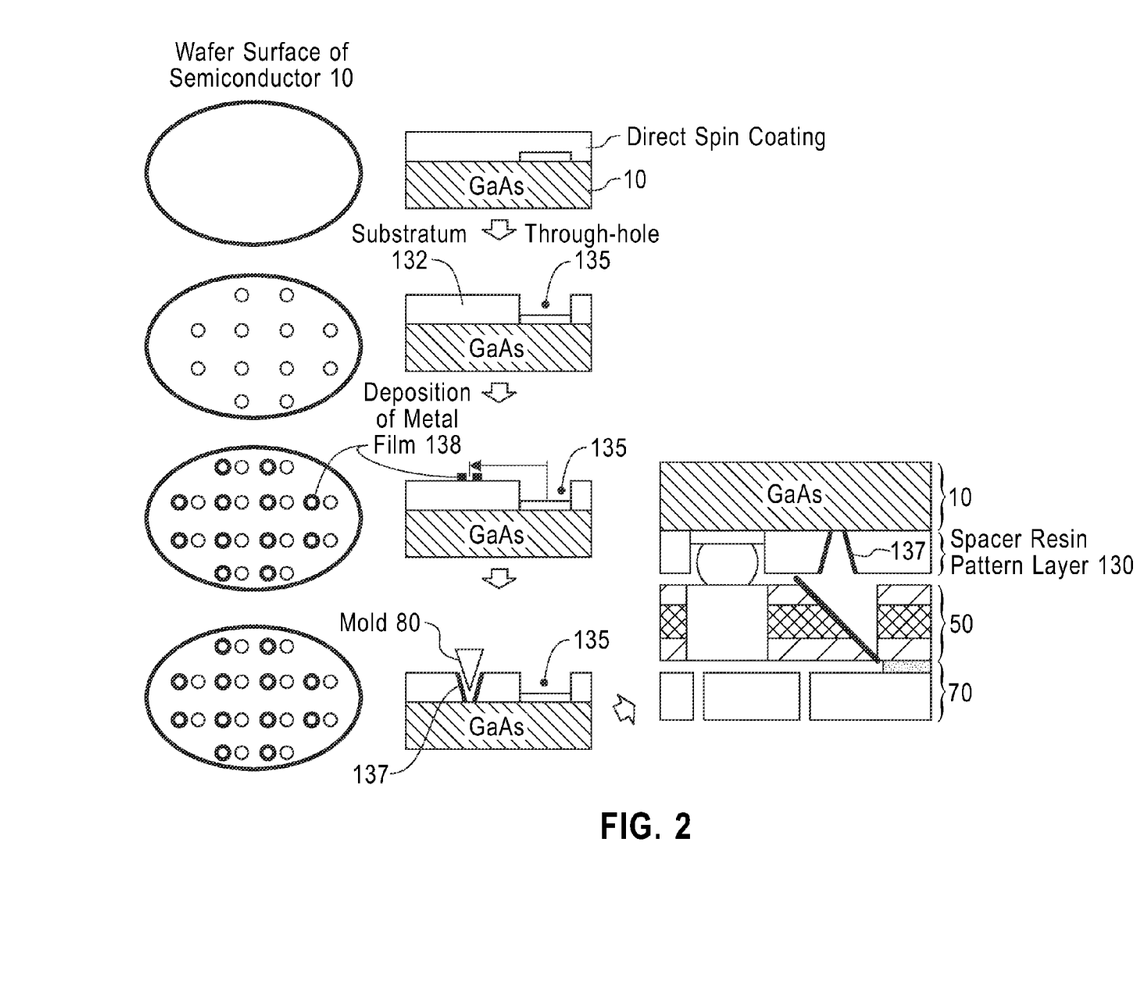
FIG. 2 is a diagram showing the method of forming, by stamping, a truncated cone-shaped three-dimensional reflective surface in the first example of the present invention.

FIG. 2 shows the method of forming a truncated cone-shaped three-dimensional reflective surface in the first example of the present invention. Stamping is the method depicted in FIG. 2.

First, substratum 132 of resin, having through-hole 135 provided for electrical communication with electrical circuit pattern layer 70, is formed on semiconductor 10.

Substratum 132 of resin can be formed by spin coating the resin on the wafer of semiconductor 10.

Next, through-hole 135 may be formed, using any conventional method, to establish an electrical connection with the electrical circuit pattern layer 70.

The spin coat process is effective on the semiconductor wafer level process because of high affinity.

Next, a truncated cone-shaped three-dimensional reflective surface 137, which can be round or polygonal in shape, is formed on substratum 132 of resin to guide the emitted light towards optical waveguide pattern layer 50 or to guide the received light from optical waveguide pattern layer 50.

When forming the truncated cone-shaped three-dimensional reflective surface 137, a metal film 138 is deposited planarly on the surface of substratum 132 in a predetermined range from the center when positioned relative to through-hole 135. Metal film 138 can be donut-shaped, or round or polygonal in shape.

This process is advantageous with respect to precision on the semiconductor wafer level process because it makes it easier to establish a position reference.

Other possible methods to deposit metal film 138 can be considered by those skilled in the art.

A truncated cone-shaped mold 80 is stamped in the center. The truncated cone-shaped mold 80 can be round or polygonal in shape and can be made of gold. Other possible stamping methods can also be devised by those skilled in the art.

When a mold with a pointed shape is used, it is easy to plastically deform substratum 132 of resin.

The deposited metal film 138 can be any metal that can be stamped into a three-dimensional reflective surface, but gold is preferred. Because gold is a very stretchable metal, it can be expected to readily stretch and be uniformly fixed to the inside of the truncated cone-shaped three-dimensional reflective surface, the surface of which can be round or polygonal in shape.

Even when stamped, there is a chance the resin material of substratum 132 will not be completely removed to expose the surface of semiconductor 10. However, this has no significant impact on the optical characteristics if the resin material of substratum 132 is a transparent material.

Figure 3:
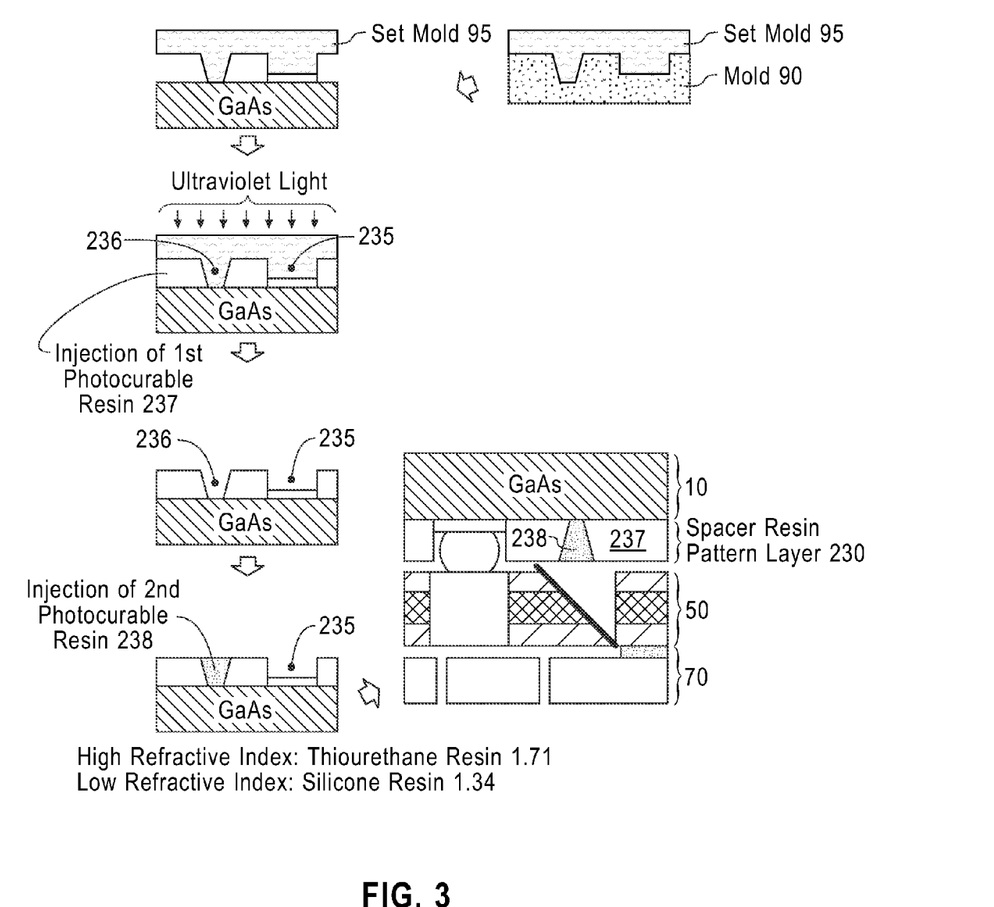
FIG. 3 is a diagram showing the method of forming a truncated cone-shaped tapered portion with a higher refractive index in the second example of the present invention.

FIG. 3 is a diagram showing the method of forming a truncated cone-shaped tapered portion with a higher refractive index in this second example of the present invention.

First, a truncated cone-shaped tapered portion having a refractive index greater than the refractive index of the surrounding substratum formed in the substratum is used to guide the emitted light towards optical waveguide pattern layer 50 or to guide the received light from optical waveguide pattern layer 50. The truncated cone-shaped tapered portion can be round or polygonal in shape.

To form the truncated cone-shaped tapered portion, set mold 95 is set on the wafer of semiconductor 10. Set mold 95 can be made of a transparent resin, allowing light, such as ultraviolet light, to pass through. Set mold 95 also portion 236 corresponding to the truncated cone-shaped tapered portion and portion 235 corresponding to the through-hole provided for electrical communication with the electrical circuit pattern layer.

Set mold 95 can be created based on the mold 90. Set mold 95 can also be reused depending on the material selected.

Next, first photocurable resin 237 is injected into the space between the wafer of the semiconductor 10 and set mold 95.

The injected first photocurable resin 237 is cured by exposing the resin to light passing through set mold 95. The light the resin is exposed to can be ultraviolet light.

Set mold 95 is removed from the cured first photocurable resin 237.

Finally, second photocurable resin 238 with a refractive index greater than that of first photocurable resin 232 is added to portion 236 corresponding to the truncated cone-shaped tapered portion.

Because second photocurable resin 238, unlike first photocurable resin 237, is not necessary to the photocuring, it can be cured by waiting for the resin to cool naturally.

An example of a specific combination of materials for first photocurable resin 237 and second photocurable resin 238 is a silicone resin with a refractive index of 1.34 serving as first photocurable resin 237 combined with a titanium dioxide nanoparticle-containing acrylic polymer with a refractive index equal to or greater than 1.9 serving as second photocurable resin 238.

If the refractive index of the filled second photocurable resin 238 is to some extent higher than the refractive index of first photocurable resin 237, the truncated cone-shaped tapered portion can function effectively to propagate light. The second photocurable resin is not limited to the particular material.

FIG. 4 is a diagram showing the method of forming a truncated cone-shaped groove in the third example of the present invention.

First, substratum 332 of resin is formed on the wafer of semiconductor 10 and through-hole 335 is provided for establishing an electrical connection with electrical circuit pattern layer 70.

When substratum 332 of resin is formed, the resin is first spin-coated directly on wafer of semiconductor 10, and then through-hole 335 is formed to establish an electrical connection with the electrical circuit pattern layer.

When substratum 332 of resin is formed, a mask pattern or layer can be used to remove partially.

Next, truncated cone-shaped groove 339 is formed in the formed substratum 332 of resin to guide the emitted light towards optical waveguide pattern layer 50 or to guide the received light from optical waveguide pattern layer 50. Truncated cone-shaped groove 339 can be round or polygonal in shape.

When truncated cone-shaped groove 339 is formed, a laser is irradiated along the truncated cone-shaped side surface towards the apex at a predetermined angle, neither at a right angle nor parallel, relative to the substratum surface or semiconductor wafer surface to partially remove the substratum and form groove 339.

When truncated cone-shaped groove 339 is formed, the laser scan can be repeated multiple times in a linear direction across the surface of the wafer of semiconductor 10. If this is performed in the traverse direction as shown in FIG. 4, multiple truncated pyramid-shaped grooves can be formed simultaneously.

FIG. 5 shows the method of forming a truncated cone-shaped three-dimensional reflective surface in the fourth example of the present invention, where initially, a truncated cone is formed and then, a thin metal film on the inside surface is formed.

First, a truncated cone-shaped tapered portion is formed in the substratum to guide the emitted light towards optical waveguide pattern layer 50 or to guide the received light from the optical waveguide pattern layer 50.

When the truncated cone-shaped tapered portion is formed, set mold 95 is set on the wafer of semiconductor 10, the wafer of which is made of resin allowing light to pass through, and which has portion 437 corresponding to the truncated cone-shaped tapered portion and portion 435 corresponding to the through-hole provided for electrical communication with the electrical circuit pattern layer.

Next, a first photocurable resin 432 is injected into the space between the wafer of (GaAs) semiconductor 10 and set mold 95.

The injected first photocurable resin is cured by exposing the resin to light passing through the mold. The light the resin is exposed to can be ultraviolet light.

Set mold 95 is removed from the cured first photocurable resin 432.

Next, a truncated cone-shaped three-dimensional reflective surface 438 is formed in truncated cone-shaped tapered portion 437 to guide the emitted light towards optical waveguide pattern layer 50 or to guide the received light from optical waveguide pattern layer 50. Both the truncated cone-shaped three-dimensional reflective surface 438 and truncated cone-shaped tapered portion 437 can be round or polygonal in shape.

Truncated cone-shaped three-dimensional reflective surface 438 can be formed by sputtering metal on the inside surface of the formed truncated cone-shaped tapered portion 437. Any technique other than sputtering that is considered useful by those skilled in the art can also be used.

If necessary, exposure via a resist or photomask can be used when the metal is sputtered. Exposure via a resist or photomask, like spin coating, has high affinity with the semiconductor wafer level process.

When a mask pattern (A) and resist are applied, a three-dimensional reflective surface similar to the one in the first example (FIG. 2) can be formed.

Also, when mask pattern (B) is applied, sputtering can be performed simultaneously, and in the same process, on pad 16 in the portion corresponding to through-hole 435, and gold is sputtered on pad 439. Gold is preferred because of its superior electrical conductivity and reliability as a contact.

When cured first photocurable resin 432 allows light to pass through, and light is to be selectively prevented from passing through in portions not used to emit or receive light, the mask pattern (B) can be effectively combined with a resin in the portions used to emit or receive light.

Figure 6:
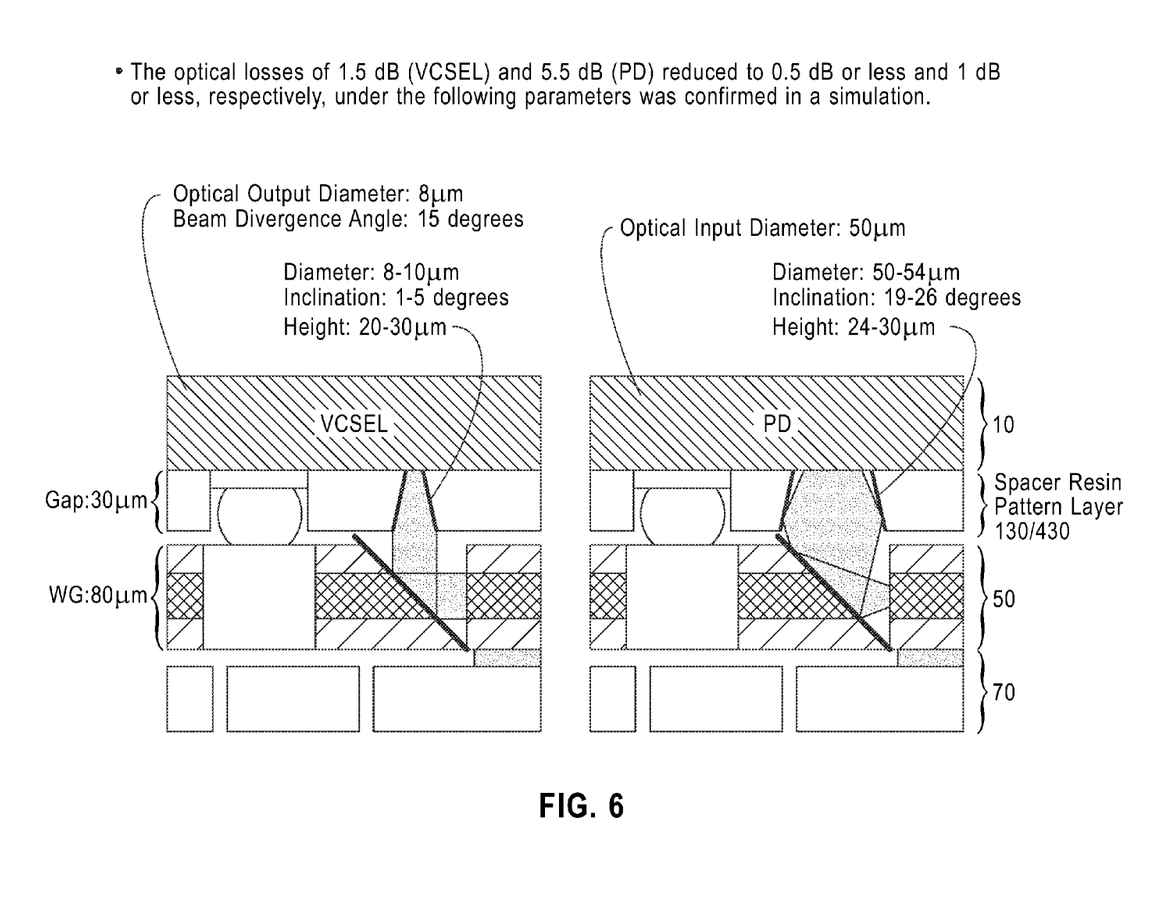
FIG. 6 is a diagram showing the effect of reducing the optical loss when a spacer resin pattern layer formed in the present invention is applied with specific parameters.

FIG. 6 shows the effect of reducing the optical loss when a spacer resin pattern layer formed in the present invention is applied to elements with specific parameters.

The thickness of the spacer resin pattern layer is from 20 to 30 μm.

When the truncated cone shape, which can be round or polygonal in shape, has a height of from 20 to 30 μm and an inclination angle relative to the wafer surface of from 1 to 5 degrees, and the gap between the semiconductor and the waveguide pattern layer (thickness: 80 μm) is set to 30 μm, under conditions in which the diameter of the light output portion of the light-emitting element is from 8 to 10 μm and the emitted light beam divergence angle is 15 degrees, optical loss of 1.5 dB is reduced to 0.5 dB or less.

When the truncated cone shape has a height of from 24 to 30 μm and an inclination angle relative to the wafer surface of from 19 to 26 degrees, and the gap between the semiconductor and the waveguide pattern layer (thickness: 80 μm) is set to 30 μm, under conditions in which the diameter of the light input portion of the light-receiving element is from 50 to 54 μm, optical loss of 5.5 dB is reduced to 1 dB or less.

Because the direction of the light is modified using a tapered structure with a truncated cone shape, which can be round or polygonal in shape, the precision tolerance for the set reflection angle of mirror 58, which has such a significant impact in the reflection direction, increases.

The invention claimed is:

1. A method for forming a spacer resin pattern layer in order to precisely align a light-emitting element or light-receiving element formed as a semiconductor wafer with respect to a waveguide pattern layer and an electrical circuit pattern layer, wherein the waveguide pattern layer and the electrical circuit pattern layer are arranged so that they are laminated on each other, the method comprising the steps of:
   forming on the semiconductor wafer a substratum of resin having a through-hole provided for electrical communication with the electrical circuit pattern layer, and
   forming a truncated cone-shaped three-dimensional reflective surface on the formed substratum of resin to guide the emitted light towards the waveguide pattern layer or to guide the received light from the waveguide pattern layer, wherein the step of forming the truncated cone-shaped three-dimensional reflective surface comprises the steps of:
   depositing metal film planarly on the surface of the substratum in a predetermined range from the center when positioned relative to the position of the through-hole, and
   stamping a truncated cone-shaped mold in the center.

2. A method according to claim 1, wherein the metal of the three-dimensional reflective surface is gold.

3. A method according to claim 1, wherein the resin of the substratum is a silicone resin.

4. A method according to claim 1, wherein a resin is formed on top of a semiconductor wafer by spin-coating in the step of forming a substratum of resin.

5. A method according to claim 1, wherein the thickness of the spacer resin pattern layer is from 20 μm to 30 μm.

6. A method for forming a spacer resin pattern layer in order to precisely align a light-emitting element or light-receiving element formed as a semiconductor with respect to a waveguide pattern layer and an electrical circuit pattern layer, wherein the waveguide pattern layer and the electrical circuit pattern layer are arranged so that they are laminated on each other, the method comprising the steps of:
   forming, in a substratum, a truncated cone-shaped tapered portion having a refractive index greater than the refractive index of the surrounding substratum to guide the emitted light towards the waveguide pattern layer or to guide the received light from the waveguide pattern layer, wherein the step of forming a truncated cone-shaped tapered portion further comprises the steps of:
   setting, on the semiconductor wafer, a mold made of resin allowing light to pass through, and having a portion corresponding to the truncated cone-shaped tapered portion and a portion corresponding to a through-hole provided for electrical communication with the electrical circuit pattern layer,
   injecting a first photocurable resin into a space between the semiconductor wafer and the set mold,
   curing the injected first photocurable resin by exposing the resin to light via the mold,
   removing the mold from the cured first photocurable resin, and
   filling the portion corresponding to the truncated cone-shaped tapered portion with a second photocurable resin having a refractive index greater than the refractive index of the first photocurable resin.

7. A method according to claim 6, wherein the resin of the substratum of a first photocurable resin is a silicone resin having a refractive index of 1.34, and the second photocurable resin filling the tapered portion of the truncated cone is a titanium dioxide nanoparticle-containing acrylic polymer having a refractive index equal to or greater than 1.9.

8. A method for forming a spacer resin pattern layer in order to precisely align a light-emitting element or light-receiving element formed as a semiconductor with respect to a waveguide pattern layer and an electrical circuit pattern layer, wherein the waveguide pattern layer and the electrical circuit pattern layer are arranged so that they are laminated on each other, the method comprising the steps of:
   forming on the semiconductor wafer a substratum of resin having a through-hole provided for electrical communication with the electrical circuit pattern layer; and
   forming a truncated cone-shaped three-dimensional reflective surface on the formed substratum of resin to guide the emitted light towards the waveguide pattern layer or to guide the received light from the waveguide pattern layer, wherein the step of forming the truncated cone-shaped groove further comprises the steps of:
   irradiating a laser along the truncated cone-shaped side surface towards the apex at a predetermined angle relative to the substratum surface or semiconductor wafer surface at an irradiation position positioned relative to the position of the through-hole to partially remove the substratum and form a groove.

9. A method according to claim 8, wherein a laser scan is repeated multiple times in a linear direction across a wafer surface in the step of forming a truncated cone-shaped groove.

10. The method for forming a spacer resin pattern layer according to claim 8, wherein the predetermined angle is more than zero but less than 90 degrees.

11. A method for forming a spacer resin pattern layer in order to precisely align a light-emitting element or light-receiving element formed as a semiconductor with respect to a waveguide pattern layer and an electrical circuit pattern layer, wherein the waveguide pattern layer and the electrical circuit pattern layer are arranged so that they are laminated on each other, the method comprising the step of:
   forming, in a substratum, a truncated cone-shaped tapered portion to guide the emitted light towards the waveguide pattern layer or to guide the received light from the waveguide pattern layer, wherein the step of forming a truncated cone-shaped tapered portion further comprises the steps of:
   setting, on the semiconductor wafer, a mold made of resin allowing light to pass through, and having a portion corresponding to the truncated cone-shaped tapered portion and a portion corresponding to a through-hole provided for electrical communication with the electrical circuit pattern layer,
   injecting a first photocurable resin into a space between the semiconductor wafer and the set mold;
   curing the injected first photocurable resin by exposing the resin to (ultraviolet) light via the mold; and removing the mold from the cured first photocurable resin; and forming, in the formed truncated cone-shaped tapered portion, a truncated cone-shaped three-dimensional reflective surface to guide the emitted light towards the waveguide pattern layer or to guide the received light from the waveguide pattern layer, wherein the step of forming a truncated cone-shaped three-dimensional reflective surface further comprising the step of:

sputtering metal on the inside surface of the formed truncated cone-shaped tapered portion.

12. A spacer resin pattern layer prepared by a method according to claim 1.

13. A laminate of a substrate having formed thereon a spacer resin pattern layer according to claim 1.

14. A laminate according to claim 13, wherein the shape of the truncated cone shape has a height of from 20 to 30 μm and an inclination angle relative to the wafer surface of from 1 to 5 degrees, wherein the gap between the semiconductor and the waveguide pattern layer is set to 30 μm, under conditions in which the diameter of the light output portion of the light-emitting element is from 8 to 10 μm and the emitted light beam divergence angle is 15 degrees.

15. A laminate according to claim 13, wherein the shape of the truncated cone shape has a height of from 24 to 30 μm and an inclination angle relative to the wafer surface of from 19 to 26 degrees.

16. A laminate according to claim 15, wherein the gap between the semiconductor and the waveguide pattern layer is set to 30 μm, under conditions in which the diameter of the light input portion of the light-receiving element is from 50 to 54 μm.

17. A laminate according to claim 16, wherein a waveguide pattern layer and an electrical circuit pattern layer arranged so that they are laminated on each other.

18. A laminate according to claim 17, wherein the semiconductor is connected to the electrical circuit pattern layer via a through-hole in a precisely aligned state.

* * * * *